United States Patent [19]

Hartl

[11] Patent Number: 4,614,387

[45] Date of Patent: Sep. 30, 1986

[54] CONNECTING ELEMENT FOR CHIP CARRIERS

[75] Inventor: Walter Hartl, Winnenden, Fed. Rep. of Germany

[73] Assignee: International Standard Electric Corporation, New York, N.Y.

[21] Appl. No.: 728,144

[22] Filed: Apr. 26, 1985

Related U.S. Application Data

[63] Continuation of Ser. No. 445,627, Nov. 30, 1982, abandoned.

[30] Foreign Application Priority Data

Dec. 4, 1981 [DE] Fed. Rep. of Germany ....... 3148018

[51] Int. Cl.[4] .............................................. H05K 1/00
[52] U.S. Cl. ............................ 339/17 CF; 339/75 MP; 339/176 MP
[58] Field of Search .......... 339/17 CF, 75 MP, 75 M, 339/176 M, 176 MP

[56] References Cited

U.S. PATENT DOCUMENTS

| | | | |
|---|---|---|---|
| 3,701,075 | 10/1972 | Schüllstrom et al. | 339/17 CF |
| 3,753,211 | 8/1973 | Pauza et al. | 339/17 CF |
| 3,866,999 | 2/1975 | Doherty, Jr. | 339/17 CF |
| 4,354,718 | 10/1982 | Bright et al. | 339/176 MP |
| 4,460,236 | 7/1984 | Strautz | 339/176 M |
| 4,460,237 | 7/1984 | Brown et al. | 339/176 MP |
| 4,560,218 | 12/1985 | Billman et al. | 339/17 CF |

Primary Examiner—Gil Weidenfeld
Assistant Examiner—Paula A. Austin
Attorney, Agent, or Firm—John T. O'Halloran; Jeffrey P. Morris

[57] ABSTRACT

A connecting element for chip carriers comprises a unitary pin frame of insulating material and a set of contact elements which are secured within the frame by injection molding. Each contact element comprises a wire segment having a terminal end projecting from the bottom of the frame to connect with a printed circuit board, the wire segment including a portion extending upward from the frame to serve as a spring leg for connection with a contact surface of a chip carrier. Connection may be made by soldering. The chip may be supported either on top of or hanging below the carrier. The spring legs press laterally into semicircular cutouts on the sides of the frame. Posts are provided on the frame for restricting the insertion depth of the contact elements. The posts may be formed by injection molding and may be located at miter-joint areas of pieces of the pin frame.

1 Claim, 8 Drawing Figures 4,614,387

CONNECTING ELEMENT FOR CHIP CARRIERS

This application is a continuation of application Ser. No. 445,627, filed Nov. 30, 1982 now abandoned.

BACKGROUND OF THE INVENTION

Connecting elements of the present type are chiefly used in microelectronics.

With various commercially available types, the electric contact elements are arranged in chambers of frame-type holders or sockets. These have an elevated rib portion surrounding the chip receptacle. With the aid of a slewably mounted or also snap-on type of frame which is provided with mechanical pressure springs, the chip carrier is pressed with its contact surfaces against the spring ends of the contact elements.

A connecting element is also already known from the European Patent Application No. 0 030 763. Instead of a press-on frame, and for fixing in position the chip carrier, there are provided several strips of spring sheet slewably mounted on respectively one outer side of the pin frame of insulating material.

It is the object of the invention to provide a simple and, from a production technical point of view, cost-effectively producible connecting element for the use with differently thick chip carriers which permits a permanent, elastic connection between the contact surfaces arranged in the marginal range of the chip carrier, and the printed conductors of a printed circuit board.

The electric contact elements can be manufactured in an advantageous manner from simple wire cuttings which, without causing any waste, are cut off a supply reel and simultaneously bent in a simple type of device. Moreover, during the manufacture of the pin frame of insulating material carried out in one single operation, they are injection moulded at the same time. Owing to the freely rising up spring legs and their arrangement touching the chip carrier on its narrow sides, there is effected an automatic equalization of the length, width and thickness tolerances of the chip carrier which are due to the manufacture, i.e., independently of the possible use of different nominal thicknesses. Moreover, there is also effected a lateral compensation of tolerances between the spring legs and the connecting surfaces of the chip carrier. In addition thereto, upon snapping-in of the spring legs, the chip carrier is centered into its semicircular cutouts. When the spring legs of the contact elements are soldered to the connecting surfaces of the chip carrier, the spring legs still remain sufficiently flexible for compensating for the different expansion behaviour of the various materials in all directions in the case of temperature variations. Further advantages are mentioned in the specification.

Examples of embodiment of the invention will now be explained in greater detail with reference to FIGS. 1 to 6 of the accompanying drawings, in which:

DESCRIPTION OF THE PREFERRED EMBODIMENT

Figure 1:
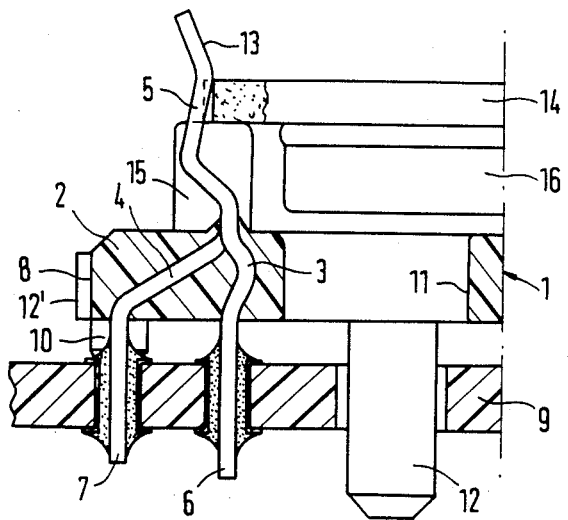
FIG. 1 shows part of the connecting element with a chip carrier, soldered into a printed circuit board, partly in a cross sectional view.
Figure 2:
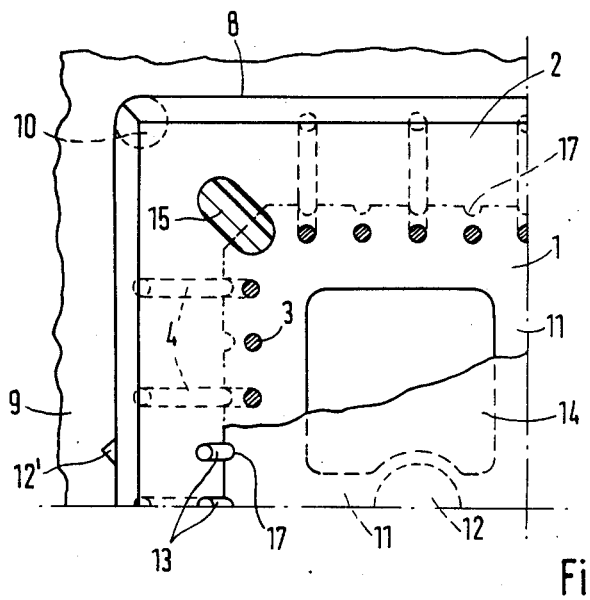
FIG. 2 shows the arrangement of FIG. 1, partly sectionally, in a top view.

In FIGS. 1 to 6 the connecting element's pin frame of insulating material is indicated by the reference numeral 1. This pin frame is preferably manufactured as a one-piece injection-moulded part in a square configuration, with the frame pieces 2 thereof having substantially a rectangular cross section. These frame pieces contain electric contact elements 3, 4 which are firmly embedded therein during the injection-moulding process, and which consist of simple wire cuttings. The spring legs 5 thereof as protruding on the top side of the frame are arranged in one row, and the terminal ends 6, 7 thereof as protruding on the bottom side of the frame, and as shown in the example of embodiment of FIG. 1, are arranged in two rows.

If the marginal contact spacing between two neighbouring terminal ends 6, 7 is to be still greater than in the aforementioned two-row arrangement, it is possible, in an alternating succession, for respectively one terminal end to be led out on the bottom side of the frame and the next one laterally on the narrow sides 8 of the pin frame 1 of insulating material, and to be bent off outside the frame pieces 2.

The arrangement of the terminal ends 6, 7 ultimately corresponds to the modular contact spacing on the printed circuit board 9, to the printed conductors of which the terminal ends 6, 7 of the contact elements 3, 4 are usually connected by way of soldering. Therefore, as in the example of embodiment shown in FIG. 1, the terminal ends 6, 7 are straight and, for being soldered into position, are inserted through the corresponding holes in the printed circuit board 9 or else, for the surface soldering, on the corresponding connecting surfaces of the printed circuit board, are either jointly bent towards the inside of the frame or jointly away from the frame pieces 2, or else are bent at an acute angle in an alternating arrangement, in relation to the surface of the printed circuit board. In the last mentioned (not shown) example of embodiment relating to the terminal ends designed for the so-called surface soldering technique, a still greater embedding into the solder can be accomplished in that the end sections thereof are provided with a repeated end, so that these sections will come to lie flat on the connecting surfaces of the printed circuit board.

Figure 3:
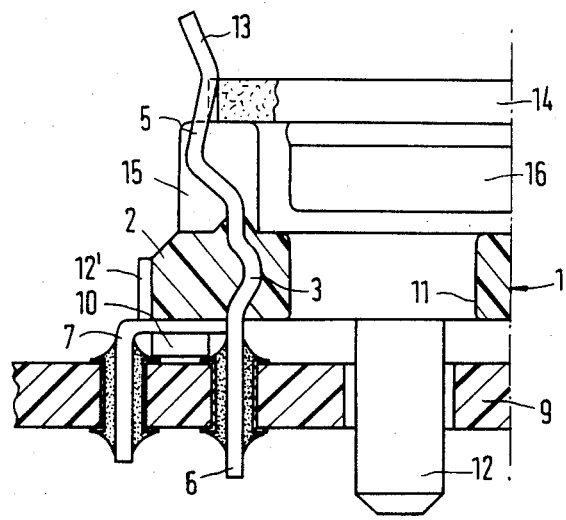
FIG. 3 and FIG. 4 show the arrangement of FIG. 1 comprising differently designed contact element connecting ends.

In the frame pieces 2, of course, the contact elements 3, 4 may also be all embedded in such a way that their terminal ends 6, 7 emerge in only one row on the bottom side of the frame, of which then alternatingly one remains straight while the next terminal end 7, directly on the bottom side of the frame, is first bent off horizontally towards the outside, and thereafter vertically (FIG. 3). The necessary mechanical strength of the contact element embedded into the frame pieces 2 is accomplished by a deformation of the coated wire cutting which, therefore, is either e.g., knurled, crimped or offset (cranked).

Figure 4:
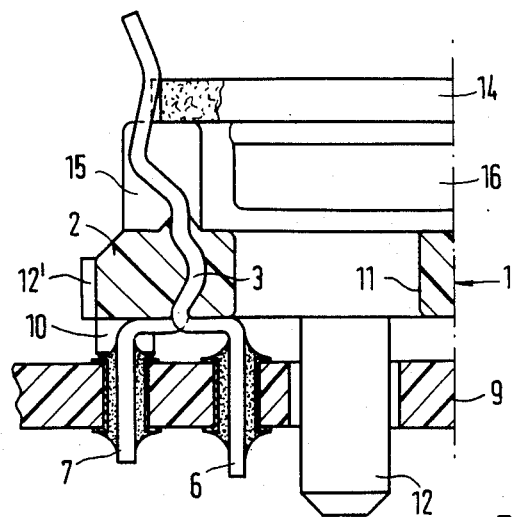

As can be seen from FIG. 4, also all contact elements 3, 4 may be alternatingly angled off directly on the bottom side of the frame in such a way that one terminal end 6 is staggered towards the inside of the frame while the other terminal end 7 is staggered towards the outside of the frame. Relative thereto, the bends can be arranged in such a way, for example, that the bent sections extending towards the inside of the frame assume a position slantingly staggered in relation to the front row, so that the vertical end sections thereof are placed behind those of the front row. Accordingly, the terminal ends 6, 7 are also capable of being inserted into such hole patterns on printed circuit boards as usually provided for in conventional clamping sockets.

In order to prevent the pin frame 1 from touching the printed circuit board 9 throughout its entire surface, several studs 10 are injection moulded to the bottom side of the frame, preferably one at each of the four outer corners, which establish the desired spacing from the printed circuit board 9 and which, during the soldering operation, safeguard an unobstructed flow of tin solder. Moreover, the pin frame 1 of insulating material is provided on its inside with two crossing webs 11 of which one, on the bottom side, carries an eccentrically arranged coding pin 12. This coding pin, owing to the asymmetrical shape of the pin frame 1, serves as a means for preventing the terminal ends 6, 7 from being faultily inserted into the hole pattern of the printed circuit board 9, and thus takes care of a faultless assembly of the connecting element. Moreover, the pin frame 1 of insulating material may be provided with a nose member 12' injection moulded thereto, serving as an optical coding aid. Preferably, one such nose member 12' each is provided on the outer narrow sides 8 of two frame pieces 2 extending parallel in relation to one another.

On the top side of the frame, the spring legs 5 of all contact elements 3, 4 are of identical design. In order to provide them with a certain elasticity in the Z-axis, hence vertically in relation to the plane of the frame, the spring legs are cranked. In cases where no special elasticity is required in the Z-axis, the spring legs 5 may also have a stretched shape. Independently of this, the end sections 13 of the spring legs 5 are somewhat bent back towards the outside of the frame so that they jointly form a funnel-shaped insertion for the chip carrier 14. In the types of embodiment as shown in the drawings, the spring legs 5 of the contact elements 3, 4 are each provided with a bulging directed towards the outer narrow side 8, with the inwardly bent section thereof again being followed by the outwardly directed end section 13 (FIG. 3).

Due to the employed process, the chip carrier 14 is provided on its four outer narrow sides with semicircular cutouts 17, with the arrangement thereof being in agreement with the hole spacing of its connecting surfaces provided for on the top and the bottom side, and to which the cutouts 17 are electrically connected via a metal coating. The spring legs 5 are arranged in accordance with this hole spacing and therefore, when inserting a chip carrier 14, can engage into the cutouts 17 thereof. The chip carrier 14 is preferably assembled with the chip 16 hanging in the downward direction. This offers the advantage that heat sinks can be stuck onto the free rearside thereof. The insertion depth of the chip carrier 14 within the spring legs 5, for example, is restricted by little blocks placed onto the frame pieces 2 or else by corresponding slide heads of an assembling device which are removed again after the spring legs 5 and the connecting surfaces have been electrically and mechanically connected by way of soldering.

In the examples of embodiment of the pin frame 1 of insulating material as shown in the drawings, there is provided on the top side of the frame, within the miter-joint areas of the frame pieces 2, each time one post 15 which altogether form a four-point support for the chip carrier 14. With a view to the known thickness dimensions of the chip carriers, the lengths of the spring legs 5 are chosen thus that they distinctly project over the posts 15. When inserting a chip carrier 14, the spring legs 14 are slightly deflected towards the outside, so that they become applied to the cutouts 17 under pressure. In some cases of practical application, this spring leg pressure is sufficient for establishing the electrical connection to the connecting surfaces and, in addition thereto, for retaining the chip carrier in a spaced relation to the frame in a mechanically self-locking manner. When employing this type of connection, a quick replacement of chip carriers is possible without further ado. In the more frequent cases of practical application, however, there is required a fixed soldered joint connection between the spring leg and the corresponding connecting surface. It is appropriate, therefore, to dimension the spacing between the first bend following the straight end section 13 of the end of the spring leg, and the post supporting surface in such a way that the bend, in the case of the most thickest of the conventional chip carrier designs, is in the mounting position somewhat above the top plate surface thereof. In this way, the chip carrier 14 always remains to be pressed against the supporting surfaces of the posts 15 until the soldering process is performed.

Figure 5:
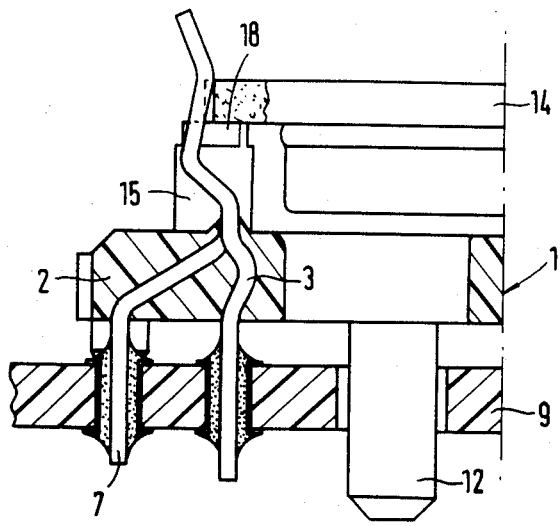
FIG. 5 shows the arrangement of FIG. 1 with posts designed to be elastic in the Z-axis.
Figure 5A:
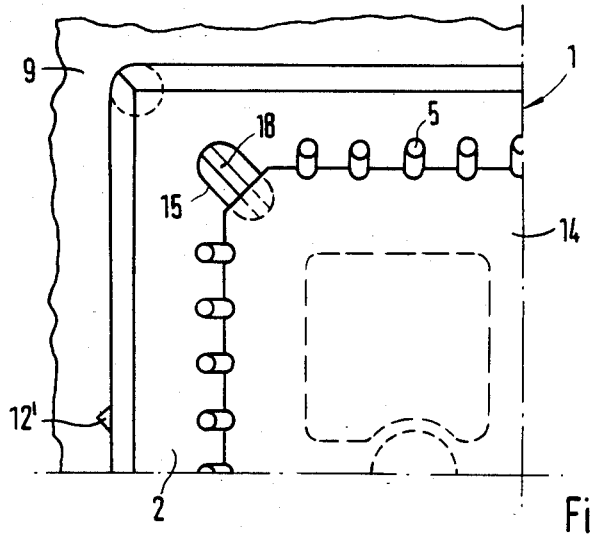
FIG. 5a shows the arrangement of FIG. 5 in a top view.
Figure 6:
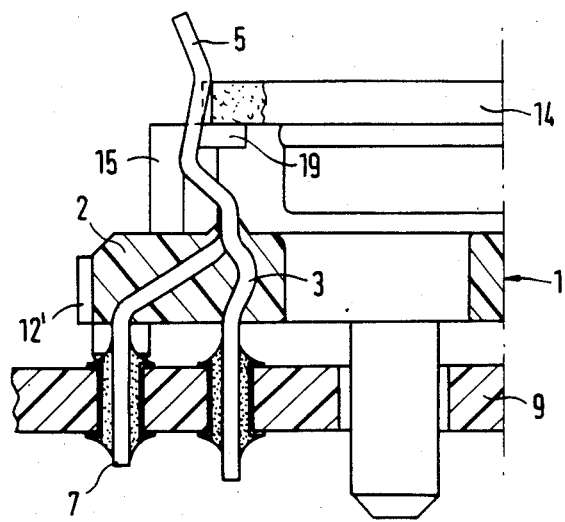
FIG. 6 shows the arrangement of FIG. 1 with a different example of embodiment of the flexible post support of the chip carrier.
Figure 6A:
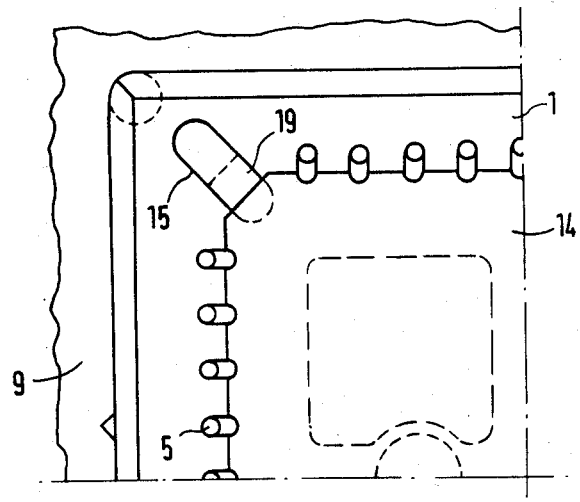
FIG. 6a shows the arrangement of FIG. 6 in a top view.

In cases where a flexibility between the chip carrier 14 and the printed circuit board 9, in the direction of the Z-axis, is required to exceed the elasticity of the spring legs 5, the posts 15, for example, may be provided with recesses or interruptions weakening the cross section thereof, so that the supporting surfaces thereof, when being correspondingly loaded, will give way. As is shown in the example of embodiment of FIGS. 5 and 5a, the post 15 may also consist of a mechanically stable base with a flexible support for the chip carrier 14 moulded upwardly to the shape of a narrow web 18. FIGS. 6 and 6a show that the flexible design of the support, amongst others, can also be realized by means of a tongue 19 projecting laterally from the post 15.

I claim:

1. A connecting element having an insulating frame in which electric contact elements having upright spring legs are mounted, for plate-shaped chip carriers having terminal pads at the edge of the plate which end at the outer narrow sides of the chip carrier, and against the sides of which said upright spring legs of said electric contact elements which are mounted in said insulting frame of the connecting element are caused to rest, and wherein the connecting ends, which protrude from the frame at the underside, are adapted to be connected to a printed circuit board, comprising:
   contact elements including lenghts of wire which are firmly embedded in said insulating frame and including spring legs having end portions which are bent back toward the outside of said frame, to form a funnel-shaped portion for inserting said chip carrier and to deflect said spring legs when a chip carrier is inserted into the connecting element; such that a first bend below the end portion is adapted to engage one of the recesses in the outer narrow sides of the chip carrier, and whereby the spring legs are positioned to be joined to the terminal pads in the recesses by soldering.

* * * * *